United States Patent
Son et al.

(10) Patent No.: US 7,364,990 B2
(45) Date of Patent: Apr. 29, 2008

(54) EPITAXIAL CRYSTAL GROWTH PROCESS IN THE MANUFACTURING OF A SEMICONDUCTOR DEVICE

(75) Inventors: Yong-Hoon Son, Yongin-si (KR);
Yu-Gyun Shin, Seongnam-si (KR);
Jong-Wook Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 72 days.

(21) Appl. No.: 11/301,029

(22) Filed: Dec. 13, 2005

(65) Prior Publication Data
US 2007/0132022 A1    Jun. 14, 2007

(30) Foreign Application Priority Data
Dec. 14, 2004   (KR) .................... 10-2004-0105300

(51) Int. Cl.
*C30B 21/36* (2006.01)
(52) U.S. Cl. ............... 438/481; 438/489; 257/E21.133; 257/E21.379; 257/E21.461; 257/E21.571
(58) Field of Classification Search ............... 438/481, 438/489, 269, 442; 257/E21.133, E21.379, 257/E21.461, E21.571
See application file for complete search history.

(56) References Cited

U.S. PATENT DOCUMENTS

| | | | |
|---|---|---|---|
| 4,507,158 A | * | 3/1985 | Kamins et al. ............. 438/413 |
| 4,522,661 A | * | 6/1985 | Morrison et al. .......... 148/33.2 |
| 4,523,370 A | * | 6/1985 | Sullivan et al. ............. 438/365 |
| 4,680,614 A | | 7/1987 | Beyer et al. |
| 5,308,445 A | * | 5/1994 | Takasu ........................ 117/90 |
| 5,915,197 A | * | 6/1999 | Yamanaka et al. .......... 438/586 |
| 6,495,294 B1 | * | 12/2002 | Yamauchi et al. .......... 438/597 |
| 6,562,707 B2 | | 5/2003 | Ryu et al. |

FOREIGN PATENT DOCUMENTS

| | | |
|---|---|---|
| JP | 2000-208644 | 7/2000 |
| KR | 1020020096743 A | 12/2002 |
| KR | 1020040037416 A | 5/2004 |
| WO | WO 8102948 A * | 10/1981 |

* cited by examiner

*Primary Examiner*—Anh D. Mai
*Assistant Examiner*—Christopher M Roland
(74) *Attorney, Agent, or Firm*—Volentine & Whitt, P.L.L.C.

(57) ABSTRACT

First and second preliminary epitaxial layers are grown from single-crystalline seeds in openings in an insulation layer until the first and second epitaxial layers are connected to each other. While the first and second preliminary epitaxial layers are being grown, a connection structure of a material having an amorphous state is formed on a portion of the insulation layer located between the first and second preliminary epitaxial layers. The material having an amorphous state is then changed into material having a single-crystalline state. Thus, portions of the first and second epitaxial layers are connected to each other through the connection structure so that the epitaxial layers and the connection structure constitute a single-crystalline structure layer that is free of voids for use as a channel layer or the like of a semiconductor device.

21 Claims, 4 Drawing Sheets

EPITAXIAL CRYSTAL GROWTH PROCESS IN THE MANUFACTURING OF A SEMICONDUCTOR DEVICE

BACKGROUND OF THE INVENTION

1. Field of the Invention

The present invention relate to a semiconductor device and to a method of manufacturing a semiconductor device. More particularly, the present invention relates to a semiconductor device including a single-crystalline structure and to a method of manufacturing a semiconductor device using an epitaxial growth process.

2. Description of the Related Art

In general, semiconductor material or the like may exist in a single-crystalline state, a polycrystalline state or an amorphous state. Atoms of a material in a single-crystalline state are arranged uniformly so that the material does not have any discontinuities. Atoms of a material in a polycrystalline state are arranged uniformly in only some of the material. Atoms of a material in an amorphous state have an irregular arrangement.

In addition, material in a polycrystalline state has grain boundaries that provide discontinuities through which a carrier, such as an electron, has difficulty moving. On the other hand, material in a single-crystalline state has hardly any grain boundaries so that a carrier, such as an electron, moves easily in single-crystalline materials. Thus, material in a single-crystalline state has relatively superior electrical characteristics compared to material in a polycrystalline state.

Accordingly, single-crystalline material is widely utilized to form the channel layer of a semiconductor device, such as a thin film transistor or a system-on-chip. For example, the single-crystalline material may be single-crystalline silicon. A structure of such single-crystalline material may be formed by a selective epitaxial growth (SEG) process or an epitaxial lateral overgrowth (ELO) process. A conventional method of forming a single-crystalline structure using a SEG process or an ELO process is disclosed in U.S. Pat. No. 6,562,707 issued to Ryu et al.

According to the conventional method, an insulation layer pattern is formed on a silicon substrate. The insulation layer pattern has openings exposing portions of the silicon substrate. The exposed portions of the silicon substrate are used as seeds. The seeds are exposed to a source gas so that layers of single-crystalline silicon are epitaxially grown on the seeds. The layers of single-crystalline silicon are epitaxially grown until they are connected to each other and thereby form a single-crystalline structure.

However, upper portions of the epitaxial layers initially connect to each other while the layers are epitaxially grown. Once the upper portions of the epitaxial layers are connected to each other, the source gas may not penetrate to the insulation layer pattern. In this case, voids may be formed between the insulation layer and the single crystalline structure.

FIG. 1 is a cross-sectional view of a conventional semiconductor device including a single-crystalline structure having a void "1". Referring to FIG. 1, epitaxial layers 14 are formed on a semiconductor substrate 10 and an insulation layer pattern 12. The upper portions of the epitaxial layers are connected to each other. As was explained above, the void "I" is formed because the upper portions of the epitaxial layers prevented the source gas from penetrating to the insulation layer pattern 12 during the epitaxial growth process.

In the case in which such a single-crystalline structure is used as a channel layer of a semiconductor device, the void degrades the electrical characteristics of the semiconductor device.

SUMMARY OF THE INVENTION

An object of the present invention is to provide a semiconductor device having a single-crystalline structure, for use as a channel layer or the like, that is substantially free of voids.

Likewise, an object of the present invention is to provide a method of manufacturing a semiconductor device in which a single-crystalline structure is formed from epitaxially grown layers without producing voids therein.

According to one aspect of the present invention, the invention provides a semiconductor that includes a first insulation structure, and a first channel structure comprising first and second epitaxial layers and a connection structure through which portions of the first and second epitaxial layers are connected. The first insulation structure has first and second openings that respectively expose first and second seeds of single-crystalline material. The first and second epitaxial layers are epitaxially grown on the first and second seeds, respectively. The connection structure is formed by depositing material having an amorphous state onto a portion of the insulation structure located between the openings therein, and transforming the amorphous material into a single-crystalline material.

In accordance with another aspect of the present invention, the invention provides a method of manufacturing a semiconductor device comprising: providing a substrate on which a first insulation structure is disposed, forming an epitaxial layer on the substrate by epitaxially growing first and second preliminary epitaxial layers on first and second seeds of single-crystalline material exposed in respective openings in the first insulation structure, forming a preliminary connection structure of amorphous material between portions of the first and second preliminary epitaxial layers before those portions become connected to each other, and transforming the amorphous material into a single-crystalline material. The first and second preliminary epitaxial layers are grown on the first and second seeds until upper portions of the first and second preliminary epitaxial layers are connected to each other. However, the preliminary connection structure is formed before the upper portions of the first and second preliminary epitaxial layers are connected.

As a result, a single-crystalline structure formed of the first epitaxial layer, the second epitaxial layer and the connection structure is formed on the first insulation structure. Therefore, hardly any voids are formed in the single-crystalline structure.

BRIEF DESCRIPTION OF THE DRAWINGS

The above and other objects, features and advantages of the present invention will become more apparent by referring to the following detailed description of the preferred embodiments thereof made in conjunction with the accompanying drawings in which.

DETAILED DESCRIPTION OF THE PREFERRED EMBODIMENTS

Figure 1:
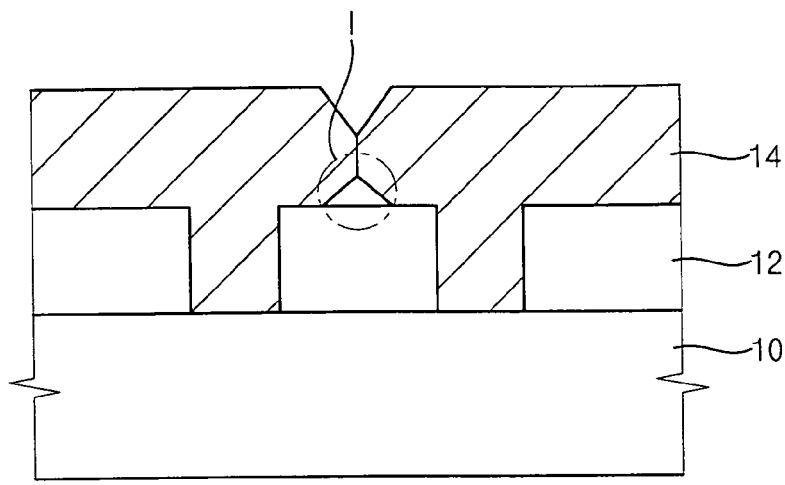
FIG. 1 is a cross-sectional view of a conventional semiconductor device including a single-crystalline structure having a void.

The present invention will now be described with reference to FIGS. 2 and 3A-3F. However, the drawings are not to scale. Rather, the sizes and relative sizes of layers and regions may be exaggerated for clarity. Also the drawings illustrate idealized aspects of the present invention. As such, variations from the illustrated shapes of features or regions as a result of, for example, manufacturing techniques and/or tolerances are to be expected. Moreover, like reference numerals designate like elements throughout the drawings.

It will also be understood that when an element or layer is referred to as being "on" and/or "connected to" another element or layer, the element or layer may be directly on and/or connected to the other element or layer or intervening elements or layers may be present. In contrast, when an element is referred to as being "directly on" and/or "directly connected to" another element or layer, no intervening elements or layers are present.

It will also be understood that spatially relative terms, such as "beneath", "below", "lower", "above", "upper" and the like are used to describe an element's and/or feature's relationship to another element(s) and/or feature(s) as illustrated in the figures. Thus, the spatially relative terms may apply to orientations in use which differ from the orientation depicted in the figures. For example, an element of a device that is disposed below or beneath another element or feature in use would instead be disposed above the other element or feature if the device were turned over. Therefore, a description in the specification of such an element being disposed above the other element or feature applies. That is, the spatially relative descriptors used herein should be interpreted according to relative orientations that are possible and not just actual orientations.

Figure 2:
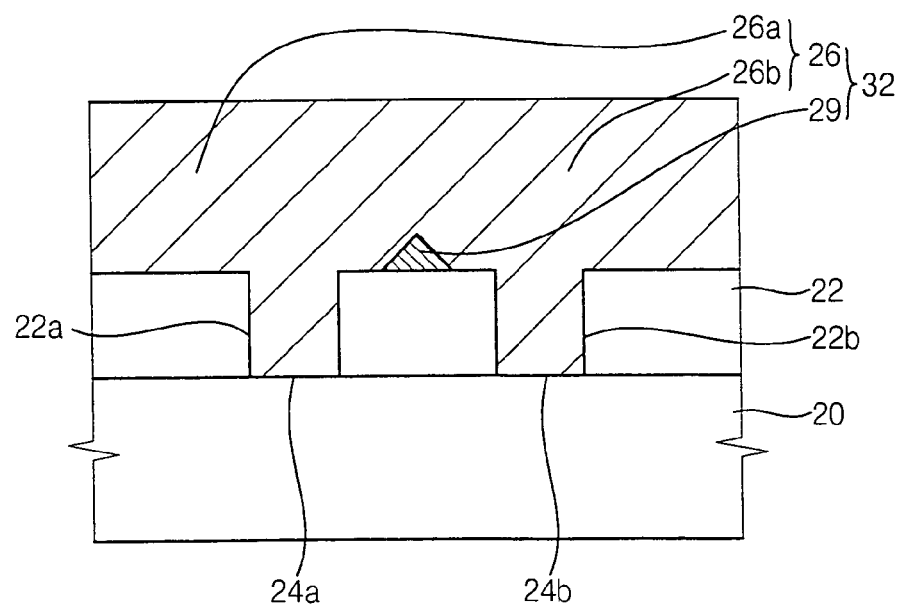
FIG. 2 is a cross-sectional view of a semiconductor device having a first channel layer in accordance with the present invention.

FIG. 2 is a cross-sectional view of a semiconductor device having a first channel layer in accordance with the present invention Referring now to FIG. 2, a semiconductor device according to the present invention comprises a first insulation structure 22 having first and second openings 22a and 22b that expose first and second seeds 24a and 24b, respectively. The first and second seeds 24a and 24b may include single-crystalline silicon. For example, the first and second seeds 24a and 24b may be portions of a silicon substrate 20. Alternatively, the first and second seeds 24a and 24b may be portions of a silicon-on-insulator (SOI) substrate. As another alternative, the first and second seeds 24a and 24b may be portions of an epitaxial layer grown from seeds including single-crystalline silicon. The first insulation structure 22 may be formed by partially removing an insulation layer of silicon oxide.

The semiconductor device also has a first single-crystalline structure 32 on the first insulation structure 22 and silicon substrate 20. The first single-crystalline structure 32 is constituted by an epitaxial layer 26 and a connection structure 29. The epitaxial layer 26 has a first epitaxial portion 26a and a second epitaxial portion 26b.

The first epitaxial portion 26a and the second epitaxial portion 26b are integral. Thus, there is no interface between the first epitaxial portion 26a and the second epitaxial portion 26b. The epitaxial layer 26 and the connection structure 29 are also integral. Thus, there is also no interface between the epitaxial layer 26 and the connection structure 29.

Also, as will be described in more detail later on, the first and second epitaxial layers 26a and 26b are epitaxially grown on the first and second seeds 24a and 24b, respectively. Thus, the first epitaxial layer 26a is of a material substantially the same as that constituting the first seed 24a. Likewise, the second epitaxial layer 26b is of a material substantially the same as that constituting the second seed 24b. Thus, the first and second epitaxial layers 26a and 26b comprise single-crystalline silicon because the first and second seeds 24a and 24b are portions of a silicon substrate, a silicon-on-insulator (SOI) substrate, or an epitaxial layer of single-crystalline silicon.

The connection structure 29 connects (lower) portions of the first epitaxial layer 26 and the second epitaxial layer 26b. The connection structure 29 is also of single-crystalline silicon. As described above, the first single-crystalline structure 32 is constituted by the first epitaxial layer 26a, the second epitaxial layer 26b and the connection structure 29 of single-crystalline silicon. Thus, the first single-crystalline structure 32 can provide an effective channel because the connection structure 29 obviates the forming of voids between the first and second epitaxial layers 26a and 26b.

FIGS. 3A to 3E are cross-sectional views illustrating a method of manufacturing the semiconductor device shown in FIG. 2.

Figure 3A:
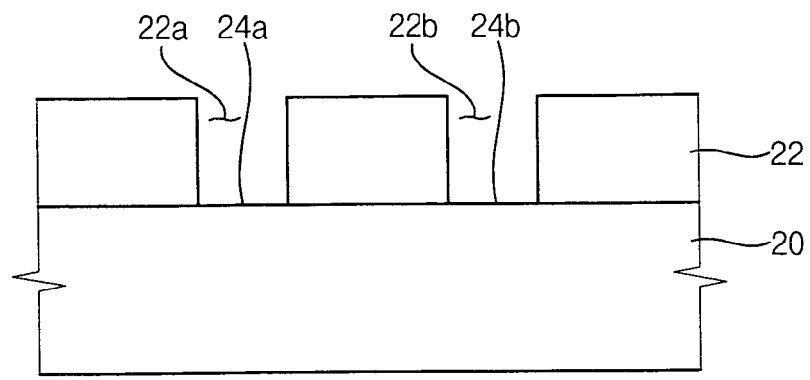
FIGS. 3A to 3E are cross-sectional views of a semiconductor substrate, illustrating methods of manufacturing the semiconductor device shown in FIG. 2.

Referring to FIG. 3A, a first insulation layer (not shown) is formed on a silicon substrate 20. The first insulation layer may comprise silicon oxide. A semiconductor structure such as a gate electrode, metal wiring or a logic device may be present on the silicon substrate 20.

Next, the first insulation layer is partially removed by a photolithography process to form a first insulation structure 22 having first and second openings 22a and 22b. The first and second openings 22a and 22b expose first and second seeds 24a and 24b, respectively. The first and second seeds 24a and 24b may be portions of the silicon substrate 20, respectively.

A surface treatment process may be performed after the first insulation structure 22 is formed on the silicon substrate 20. In particular, a surface treatment process may be performed to remove a native oxide from the first and second seeds 24a and 24b. To this end, the first and second seeds 24a and 24b may be treated with a hydrogen fluoride (HF) solution. In this case, the first and second seeds 24a and 24b are protected by hydrogen that attaches to the first and second seeds 24a and 24b.

Figure 3B:
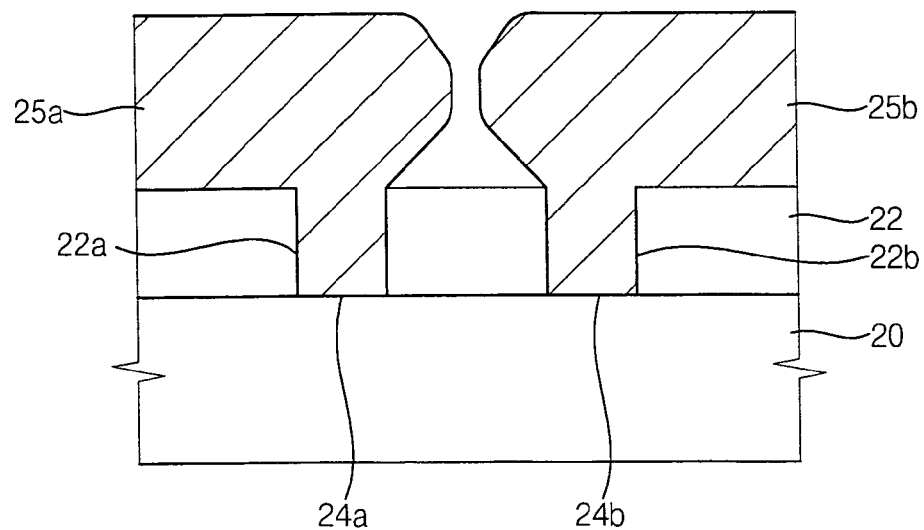

Referring to FIG. 3B, first and second preliminary epitaxial layers 25a and 25b are epitaxially grown on the first and second seeds 24a and 24b, respectively. More specifically, the first and second preliminary epitaxial layers 25a and 25b are epitaxially grown by introducing a reaction gas directly onto the first and second seeds 24a and 24b. Preferably, the first and second preliminary epitaxial layers 25a and 25b are epitaxially grown at a temperature of about 750° C. to about 1,250° C. and, more preferably, at a temperature of about 800° C. to about 900° C.

If the first and second preliminary epitaxial layers 25a and 25b were to be epitaxially grown at a temperature below about 750° C., the growth rate of the first and second preliminary epitaxial layers 25a and 25b would be too low. On the other hand, if the first and second preliminary epitaxial layers 25a and 25b were to be epitaxially grown at a temperature of above about 1,250° C., the growth rates of the first and second preliminary epitaxial layers 25a and 25b could not be effectively controlled, and the silicon substrate 20 could be damaged.

The reaction gas includes a source of silicon. For example, the reaction gas may include tetrachlorosilane ($SiCl_4$), silane ($SiH_4$), dichlorosilane ($SiH2Cl_2$) or trichlorosilane ($SiHCl_3$). These may be used alone or in combination.

As a result, as shown in FIG. 3B, the first and second preliminary epitaxial layers 25a and 25b grow out of the first and second openings 22a and 22b, respectively. However, the first and second preliminary epitaxial layers 25a and 25b are spaced apart from each other.

More specifically, the growing of the first and second preliminary epitaxial layers 25a and 25b may be terminated before the first and second preliminary epitaxial layers 25a and 25b are connected to each other. In particular, the first and second preliminary epitaxial layers 25a and 25b may be kept apart by controlling the duration of the process, given that the rate at which the first and second preliminary epitaxial layers 25a and 25b is known in the preferred temperature range. Basically, the process is controlled so that it is terminated once the first and second preliminary epitaxial layers 25a and 25b achieve a thickness that is significantly greater than the depths of the first and second openings 22a and 22b. At this time, the horizontal growth rates of the first and second preliminary epitaxial layers 25a and 25b become substantially greater than the vertical growth rates of the first and second preliminary epitaxial layers 25a and 25b.

Figure 3C:
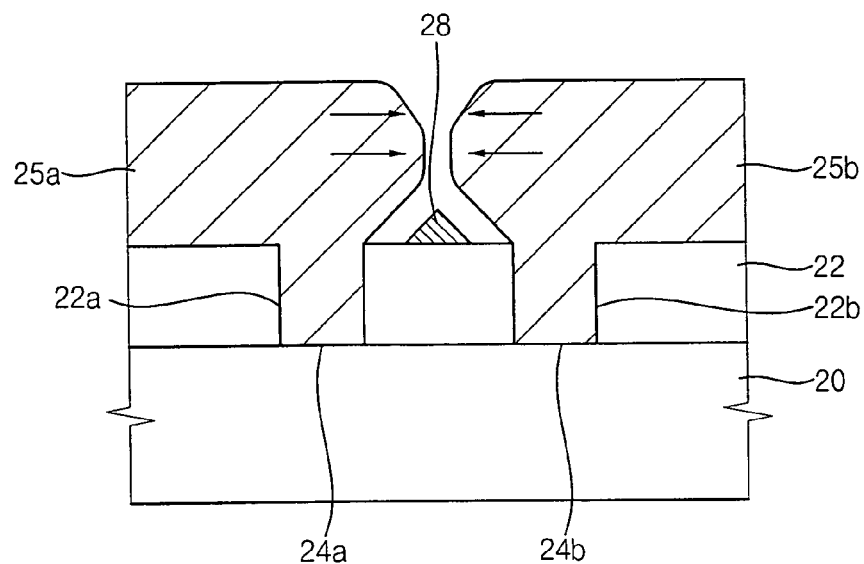

Referring to FIG. 3C, a preliminary connection structure 28 is then formed by a deposition process on a portion of the first insulation structure 22 interposed between the first and second openings 22a and 22b. That is, the preliminary connection structure 28 is formed by introducing a reaction gas directly onto a portion of the first insulation structure 22 exposed between the first and second preliminary epitaxial layers 25a and 25b. Preferably, the preliminary connection structure 28 is formed at a temperature of about 400° C. to about 600° C. and, more preferably, at a temperature of about 520° C. to about 540° C. Also, in some cases, the temperature at which the preliminary connection structure 28 is formed may be gradually increased from about 400° C. to about 600° C.

At temperatures below about 400° C., the reaction gas required for forming the preliminary connection structure 28 would not be sufficiently reactive. On the other hand, if the preliminary connection structure 28 were to be formed at a temperature above about 600° C., the thickness of the preliminary connection structure 28 could not be effectively controlled. Furthermore, the first and second preliminary epitaxial layers 25a and 25b also begin to grow when the preliminary connection structure 28 is formed. Thus, if the preliminary connection structure 28 were formed at a temperature above about 600° C., the horizontal growth rates of the first and second preliminary epitaxial layers 25a and 25b could not be effectively controlled.

The preliminary connection structure 28 may be of amorphous silicon. The reaction gas includes a source of the silicon. For example, the reaction gas may comprise silane, dichlorosilane, trichlorosilane or tetrachlorosilane. These may be used alone or in combination. Nitrogen ($N_2$) may be used as a carrier gas to form the preliminary connection structure 28. The flow rate of the nitrogen gas is controlled to prevent silicon atoms from the reaction gas from diffusing into surfaces of the preliminary connection structure 28, the first preliminary epitaxial layer 25a and/or the second preliminary epitaxial layer 25b. To this end, the flow rate of the carrier gas is controlled to be substantially smaller than that of the reaction gas. For example, in the case in which the flow rate of the reaction gas is in a range of about 20 sccm to 200 sccm, the flow rate of the nitrogen gas will be in a range of about 0.01 sccm to about 200 sccm. In the case in which the flow rate of the reaction gas is about 100 sccm, the flow rate of the nitrogen gas is in a range of about 0.01 sccm to about 100 sccm.

Under these conditions, as described above, the first and the second preliminary epitaxial layers 25a and 25b begin to grow while the preliminary connection structure 28 is being formed. However, the growth rate of the preliminary structure 28 is substantially larger than those of the first and second preliminary epitaxial layers 25a and 25b. For example, the process conditions are selected such that the growth rate of the preliminary structure 28 is at least twice the growth rate of each of the first and second preliminary epitaxial layers 25a and 25b. Thus, the preliminary connection structure 28 is connected between lower portions of the first and second preliminary epitaxial layers 25a and 25b before the upper portions of the first and second preliminary epitaxial layers 25a and 25b are connected. Accordingly, voids are not formed between the first and second epitaxial layers 26a and 26b.

The epitaxial growth process for growing the first and second preliminary epitaxial layers 25a and 25b and deposition process for forming the preliminary connection structure 28 may be formed in-situ or the deposition process may be performed ex-situ with respect to the epitaxial growth process.

In the case in which the processes are performed ex-situ, the epitaxial growth process may be performed on wafers one at a time (single-wafer type process) whereas the deposition process may be performed as a batch process. Furthermore, the epitaxial growth process and the deposition process may be performed at substantially different pressures. For example, the epitaxial growth process may be performed at a pressure of about 10 Torr, in which case the deposition process is performed at a pressure of about 0.4 Torr.

On the other hand, in the case in which the epitaxial growth process and the deposition process are formed in-situ, the process conditions of the epitaxial growth process may be substantially the same as those of the deposition process with the exception of temperature.

Figure 3D:
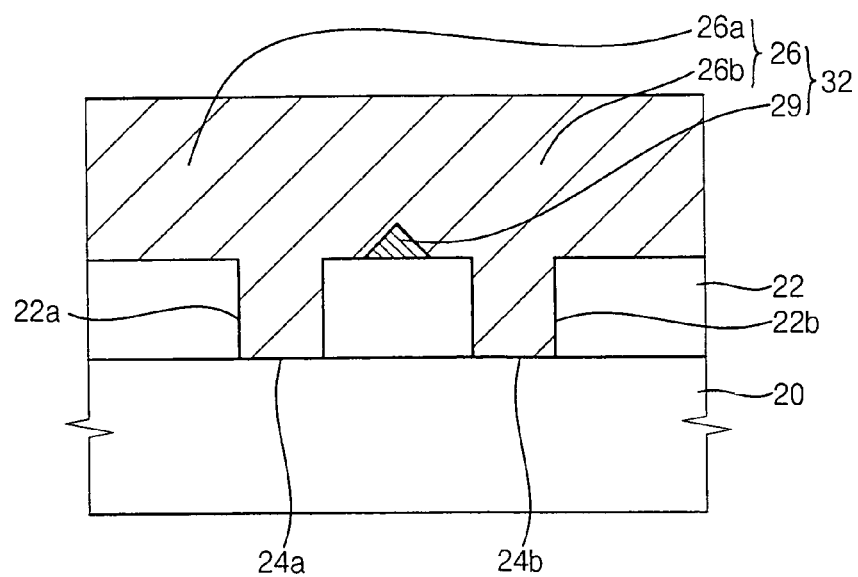

Referring to FIG. 3D, the first and second preliminary epitaxial layers 25a and 25b are grown to form first and second epitaxial layers 26a and 26b, respectively. More specifically, lower portions of the first and second epitaxial layers 26a and 26b are connected to each other through a final form of the connection structure, hereinafter referred to merely as connection structure 29. Upper portions of the first and second epitaxial layers 26a and 26b are directly connected to each other. However, if the preliminary connection structure 28 is formed of amorphous silicon, the amorphous silicon must be transformed into single-crystalline silicon because amorphous silicon has relatively poor electrical characteristics.

To this end, the amorphous silicon may be thermally treated. Preferably, the amorphous silicon is thermally treated at a temperature of about 570° C. to about 650° C. and, more preferably, at a temperature of about 600° C. to about 620° C. At temperatures below about 570° C., amorphous silicon will not sufficiently transform into single-crystalline silicon. On the other hand, at temperatures above about 650° C., the thermal treatment process cannot be satisfactorily controlled.

Also, the first and second epitaxial layers 26a and 26b may be used as a seed when performing the thermal treatment process. Thus, the preliminary connection structure 28 is efficiently transformed into the connection structure 29.

Alternatively, the amorphous silicon of the preliminary connection structure 28 may be transformed into single-crystalline silicon by irradiating the connection structure 28 using a laser.

Figure 3E:
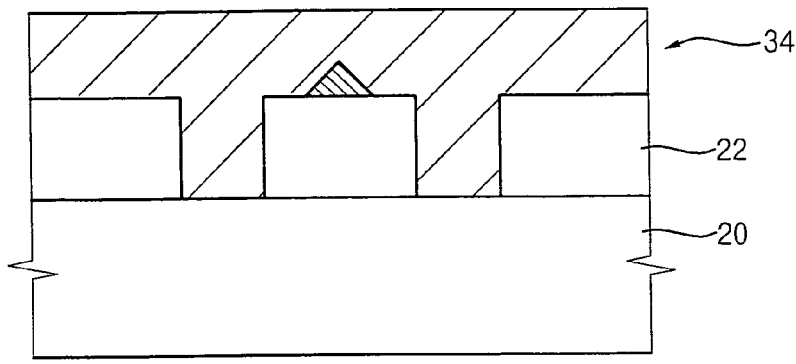

Referring to FIG. 3E, a surface portion of the first single-crystalline structure 32 may be planarized to form a first channel layer 34. The planarization may be carried out by an etch-back process and/or a chemical mechanical polishing process. However, the single-crystalline structure 32 does not have to be planarized to be used as a channel layer 34.

Figure 3F:
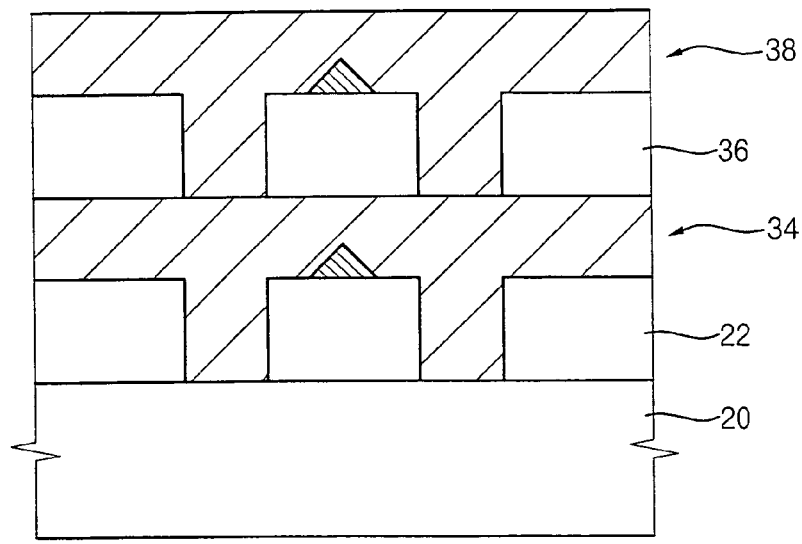
FIG. 3F is a cross-sectional view of a semiconductor device having multiple channel layers in accordance with the present invention.

FIG. 3F is a cross-sectional view of a semiconductor device having multiple channel layers in accordance with the present invention.

The semiconductor device may have a multi-layered channel structure. In this respect, and referring to FIG. 3F, a second insulation structure 36 may be formed on the first channel layer 34. The second insulation structure 26 may be formed by processes substantially the same as those illustrated in and already described with respect to FIG. 3A. Thus, these processes will not be further described.

A second channel layer 38 may be formed on the first channel layer 34 and the second insulation structure 36. The second channel layer 38 may be formed by processes substantially the same as those illustrated in and already described with respect to FIGS. 3B to 3E. Thus, these processes will also not be described further.

In addition, third to n-th insulation structures may be formed by processes substantially the same as those illustrated in and already described with respect to FIG. 3A, wherein "n" is a natural number equal to at least 4. Similarly, third to n-th channel layers may be formed by processes substantially the same as those illustrated in and already described with respect to FIGS. 3B to 3E, wherein "n" is a natural number equal to at least 4. Thus, the first to n-th channel layers may be electrically connected to each other in a vertical direction.

According to the present invention as described above, a channel layer formed by an epitaxial growth process has hardly a void or any voids therein, especially compared to the prior art in which no connection structure is provided. Thus, the present invention provides a semiconductor device that has at least channel layer whose reliability is enhanced.

Finally, although the present invention has been described above in connection with the preferred embodiments thereof, the present invention is not so limited. Rather, modifications of the preferred embodiments will become readily apparent those skilled in the art. Accordingly, the true spirit and scope of the invention is not limited by the foregoing description of the preferred embodiments thereof but by the appended claims.

What is claimed is:

1. A method of manufacturing a semiconductor device, the method comprising:
   providing a substrate on which an insulation structure is disposed, the insulation structure having first and second openings, and on which first and second seeds are respectively exposed by the first and second openings, the first and second seeds being of a single-crystalline material; and
   forming a single-crystalline structure on the substrate by epitaxially growing first and second preliminary epitaxial layers on the first and second seeds, respectively, until upper portions of the first and second preliminary epitaxial layers protrude from the first and second openings, respectively, such that upper portions of the first and second preliminary epitaxial layers confront each other above the insulation structure,
   before the upper portions of the first and second preliminary epitaxial layers are connected directly to each other above the insulation structure, performing a deposition process comprising selectively forming material having an amorphous state on the insulation structure in between the unconnected portions of the first and second preliminary epitaxial layers, and growing the material having an amorphous state such that a preliminary connection structure of the material having an amorphous state contacts lower portions of the first and second preliminary epitaxial layers before the upper portions of the first and second preliminary epitaxial layers are connected, and
   forming a connection structure by transforming the material of the preliminary connection structure having an amorphous state into a single-crystalline material.

2. The method of claim 1, wherein the substrate is a silicon substrate or a silicon-on-insulator substrate.

3. The method of claim 1, wherein the first and second seeds are portions of an epitaxial layer of single-crystalline silicon.

4. The method of claim 1, wherein the insulation structure comprises an oxide.

5. The method of claim 1, wherein the first and second preliminary epitiaxial layers are grown by introducing a reaction gas including a source of silicon onto the first and second seeds while maintaining a temperature of the ambient atmosphere around the seeds at about 750° C. to about 1,250° C.

6. The method of claim 5, wherein the reaction gas includes at least one gas selected from the group consisting of tetrachlorosilane, silane, dichlorosilane and trichlorosilane.

7. The method of claim 1, wherein the deposition process comprises introducing a reaction gas including a source of silicon to a location between the unconnected portions of the first and second preliminary epitaxial layers while maintaining the ambient atmosphere around the substrate at a temperature of about 400° C. to about 600° C.

8. The method of claim 7, wherein the reaction gas includes at least one gas selected from the group consisting of tetrachlorosilane, silane, dichlorosilane and trichlorosilane.

9. The method of claim 8, wherein the deposition process also comprises introducing a carrier gas of nitrogen along with the reaction gas.

10. The method of claim 9, wherein the reaction gas is introduced at a flow rate that is greater than the flow rate at which the nitrogen gas is introduced.

11. The method of claim 1, wherein the transforming of the material of the preliminary connection structure comprises thermally treating the material having an amorphous state.

12. The method of claim 11, wherein the thermal treatment process comprises maintaining the ambient atmosphere around the material having an amorphous state at a temperature of about 570° C. to about 650° C.

13. The method of claim 1, and further comprising planarizing the first and second preliminary epitaxial layers.

14. The method of claim 1, wherein the insulation structure is a first insulation structure and the single-crystalline structure is a first single-crystalline structure, and wherein said method further comprises alternately forming at least two additional insulation structures and at least two additional single-crystalline structures over the first single-crystalline structure, wherein each of the additional insulation structures have substantially the same form and composition as the first insulation structure, and each of the additional single-crystalline structures is formed in substantially the same manner as the first single-crystalline structure.

15. The method of claim 1, wherein the deposition process comprises growing the first and second preliminary epitaxial layers laterally at respective rates along with the material having an amorphous state, and controlling the deposition process such that that rate at which the material having an amorphous state is grown is greater than rates at which the first and second preliminary epitaxial layers grow laterally during the deposition process.

16. The method of claim 15, wherein the deposition process is controlled such that that rate at which the material having an amorphous state is grown is at least twice that at which each of the first and second preliminary epitaxial layers grow laterally during the deposition process.

17. A method of manufacturing a semiconductor device, the method comprising:

providing a substrate on which an insulation structure is disposed, the insulation structure having first and second openings, and on which first and second seeds are respectively exposed by the first and second openings, the first and second seeds being of a single-crystalline material; and forming a single-crystalline silicon structure on the substrate by epitaxially growing first and second preliminary single-crystalline silicon layers on the first and second seeds, respectively, until upper portions of the first and second preliminary single-crystalline silicon layers protrude from the first and second openings, respectively, such that upper portions of the first and second preliminary single-crystalline silicon layers confront each other above the insulation structure, before the upper portions of the first and second preliminary single-crystalline silicon layers are connected directly to each other above the insulation structure, performing a deposition process comprising introducing a reaction gas including a source of silicon to a location between the unconnected portions of the first and second preliminary single-crystalline silicon layers while maintaining the ambient atmosphere around the substrate at a temperature of about 400° C. to about 600° C., and introducing a carrier gas of nitrogen along with the reaction gas at a flow rate that is substantially less than the flow rate at which the reaction gas is introduced, to thereby create a preliminary connection structure of amorphous silicon that contacts lower portions of the first and second preliminary single-crystalline silicon layers before the upper portions of the first and second preliminary single-crystalline silicon layers are connected, and forming a connection structure by transforming the amorphous silicon of the preliminary connection structure into a single-crystalline silicon.

18. The method of claim 17, wherein the flow rate of the reaction gas is at least 20 sccm, and the flow rate of the carrier gas is at least 0.01 sccm.

19. The method of claim 17, wherein the first and second preliminary single-crystalline silicon layers are grown by introducing a reaction gas including a source of silicon onto the first and second seeds while maintaining a temperature of the ambient atmosphere around the seeds at about 750° C. to about 1,250° C.

20. The method of claim 17, wherein the transforming of the material of the preliminary connection structure comprises thermally treating the amorphous silicon.

21. The method of claim 20, wherein the thermal treatment process comprises maintaining the ambient atmosphere around the amorphous silicon at a temperature of about 570° C. to about 650° C.

* * * * *